(12) United States Patent
Tomura et al.

(10) Patent No.: US 9,390,935 B2
(45) Date of Patent: Jul. 12, 2016

(54) ETCHING METHOD

(71) Applicant: TOKYO ELECTRON LIMITED, Tokyo (JP)

(72) Inventors: Maju Tomura, Miyagi (JP); Hikaru Watanabe, Miyagi (JP); Fumiya Kobayashi, Miyagi (JP); Kazuhiro Kubota, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/542,790

(22) Filed: Nov. 17, 2014

(65) Prior Publication Data

US 2015/0170932 A1   Jun. 18, 2015

(30) Foreign Application Priority Data

Dec. 13, 2013   (JP) .................. 2013-258327

(51) Int. Cl.
  *H01L 21/3065*    (2006.01)
  *H01L 21/311*     (2006.01)
  *H01L 21/768*     (2006.01)
  *H01L 21/3213*    (2006.01)
  *H01J 37/32*      (2006.01)
  *H01L 21/67*      (2006.01)

(52) U.S. Cl.
  CPC ....... *H01L 21/3065* (2013.01); *H01J 37/32082* (2013.01); *H01J 37/32091* (2013.01); *H01J 37/32568* (2013.01); *H01L 21/31116* (2013.01); *H01L 21/31138* (2013.01); *H01L 21/31144* (2013.01); *H01L 21/32137* (2013.01); *H01L 21/32139* (2013.01); *H01L 21/67109* (2013.01); *H01L 21/76802* (2013.01); *H01L 21/76813* (2013.01); *H01J 2237/334* (2013.01)

(58) Field of Classification Search
  None
  See application file for complete search history.

(56) References Cited

U.S. PATENT DOCUMENTS

| | | | |
|---|---|---|---|
| 7,977,390 B2 | 7/2011 | Ji et al. | |
| 2011/0220609 A1* | 9/2011 | Yaegashi et al. | ................ 216/12 |
| 2012/0244718 A1* | 9/2012 | Nishimura et al. | ........... 438/710 |
| 2015/0056805 A1* | 2/2015 | Park | .................. H01L 21/76804 438/672 |

* cited by examiner

*Primary Examiner* — Jiong-Ping Lu
(74) *Attorney, Agent, or Firm* — Rothwell, Figg, Ernst & Manbeck, P.C.

(57) ABSTRACT

Provided is an etching method for forming a space with an aspect ratio of 50 or more in a workpiece including a silicon oxide film and a hard mask. The etching method includes: a first step of exposing the workpiece to plasma of a fluorocarbon-based gas within a processing container of a capacitively coupled plasma processing apparatus which includes a placing table serving as a lower electrode and an upper electrode; and a second step of further exposing the workpiece to the plasma of a fluorocarbon-based gas within a processing container of a capacitively coupled plasma processing apparatus which includes a placing table serving as a lower electrode and an upper electrode. A distance between the placing table and the upper electrode in the first step is at least 5/3 times of a distance between the placing table and the upper electrode in the first step.

8 Claims, 9 Drawing Sheets

ETCHING METHOD

CROSS-REFERENCE TO RELATED APPLICATIONS

This application is based on and claims priority from Japanese Patent Application No. 2013-258327, filed on Dec. 13, 2013, with the Japan Patent Office, the disclosure of which is incorporated herein in its entirety by reference.

TECHNICAL FIELD

An exemplary embodiment of the present disclosure relates to an etching method.

BACKGROUND

In manufacturing a semiconductor device, there is a case in which a deep hole is formed in a silicon oxide film by plasma etching. An example of such a semiconductor device includes a dynamic random access memory.

In addition, as semiconductor devices are highly integrated, an aspect ratio of a hole formed in a silicon oxide film is gradually increased. U.S. Pat. No. 7,977,390 discloses a method of achieving such a high aspect ratio. In this method, a step of depositing a protective film containing silicon on side walls of a mask and a silicon oxide film, and a step of etching the silicon oxide film are repeated alternately. The method enables formation of a deep hole by depositing the protective film to protect the mask.

SUMMARY

An aspect of the present disclosure provides an etching method for forming a space with an aspect ratio of 50 or more in a workpiece including a silicon oxide film and a hard mask by etching the silicon oxide film through the hard mask. The etching method includes: (a) a first step of exposing the workpiece to plasma of a fluorocarbon-based gas within a processing container of a capacitively coupled plasma processing apparatus which includes a placing table serving as a lower electrode, and an upper electrode; and (b) a second step of further exposing the workpiece to the plasma of a fluorocarbon-based gas within a processing container of a capacitively coupled plasma processing apparatus which includes a placing table serving as a lower electrode and an upper electrode. In this method, a distance between the placing table and the upper electrode in the second step is at least 5/3 times of a distance between the placing table and the upper electrode in the first step. In an exemplary embodiment, the distance between the placing table and the upper electrode in the second step is 50 mm or more.

The foregoing summary is illustrative only and is not intended to be in any way limiting. In addition to the illustrative aspects, embodiments, and features described above, further aspects, exemplary embodiments, and features will become apparent by reference to the drawings and the following detailed description.

DETAILED DESCRIPTION

Figure 1:
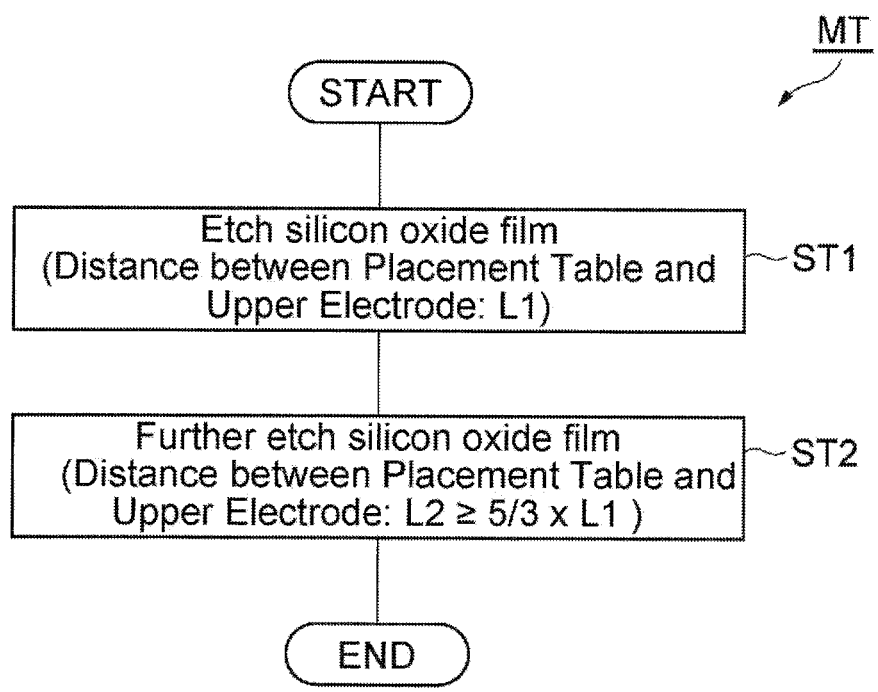
FIG. 1 is a flowchart illustrating an etching method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An aspect ratio of a hole formed in a workpiece by etching of a silicon oxide film is reaching a region of 50 or more. However, when the above-described conventional methods are used for forming a hole with an aspect ratio of such a range, a protective film may block an opening of a mask. In addition, activated species may not arrive at a deep portion of the hole so that etching may not progress.

Accordingly, what is requested is an etching method that etches a silicon oxide film to form a space with an aspect ratio of 50 or more in a workpiece.

An aspect provides an etching method for forming a space with an aspect ratio of 50 or more in a workpiece including a silicon oxide film and a hard mask by etching the silicon oxide film through the hard mask. That is, a method of etching a silicon oxide film is provided to form a space with an aspect ratio of 50 or more which is continued from a surface of the hard mask to the silicon oxide film. The etching method includes: (a) a first step of exposing the workpiece to plasma of a fluorocarbon-based gas within a processing container of a capacitively coupled plasma processing apparatus which includes a placing table serving as a lower electrode and an upper electrode; and (b) a second step of further exposing the workpiece to the plasma of a fluorocarbon-based gas within a processing container of a capacitively coupled plasma processing apparatus which includes a placing table serving as a lower electrode and an upper electrode. In this method, a distance between the placing table and the upper electrode in the second step is at least 5/3 times of a distance between the placing table and the upper electrode in the first step. In an exemplary embodiment, the distance between the placing table and the upper electrode in the second step is 50 mm or more.

In the first step, the etching of the silicon oxide film is etched until a space with a predetermined depth is formed in the workpiece, for example, until the space formed in the workpiece reaches a predetermined depth with an aspect ratio of 40 or less. In the second step subsequent to the first step, the silicon oxide is further etched under a distance between the placing table and the upper electrode which is longer than the distance between the placing table and the upper electrode in the first step. When the distance between the placing table and the upper electrode is increased, it may be possible to increase ion energy and reduce ion flux while suppressing a variation in generated activated species, i.e. while maintaining generation of low order activated species. Here, the etching rate of the hard mask is increased depending on the ion energy and the ion flux. In addition, the etching rate in a deep portion of a space with a high aspect ratio is increased mainly depending on the ion energy. Therefore, according to the present method, a space with a high aspect ratio of 50 or more may be formed in the silicon oxide film while suppressing the etching of the hard mask. In addition, although high order activated species is not able to reach a deep portion of a hole and etches an upper portion of the silicon oxide film in a horizontal direction, i.e. a direction orthogonal to the depth direction of the space, low order activated species may reach the deep portion of the space. Thus, according to the present disclosure, it may be possible to prevent occurrence of bowing, i.e. a phenomenon that the space formed in the silicon oxide film is widened in the horizontal direction at a portion thereof in the depth direction.

In an exemplary embodiment, the gas species of a gas supplied into the processing chamber is unchanged during a period from the first step to the second step. In addition, in an exemplary embodiment, during the period from the first step to the second step, a silicon-containing gas is not supplied to the processing container. That is, the etching of the first step and the second step may be performed without generating plasma of a gas for forming a silicon-containing protective film. As a result, it may be possible to suppress an opening of the hard mask from being blocked.

As described above, an etching method for forming a space with an aspect of 50 or more in a workpiece by etching a silicon oxide film is provided.

Hereinafter, various exemplary embodiments will be described in detail with reference to the accompanying drawings. Same or corresponding portions in the drawings will be denoted by the same symbols.

Figure 2:
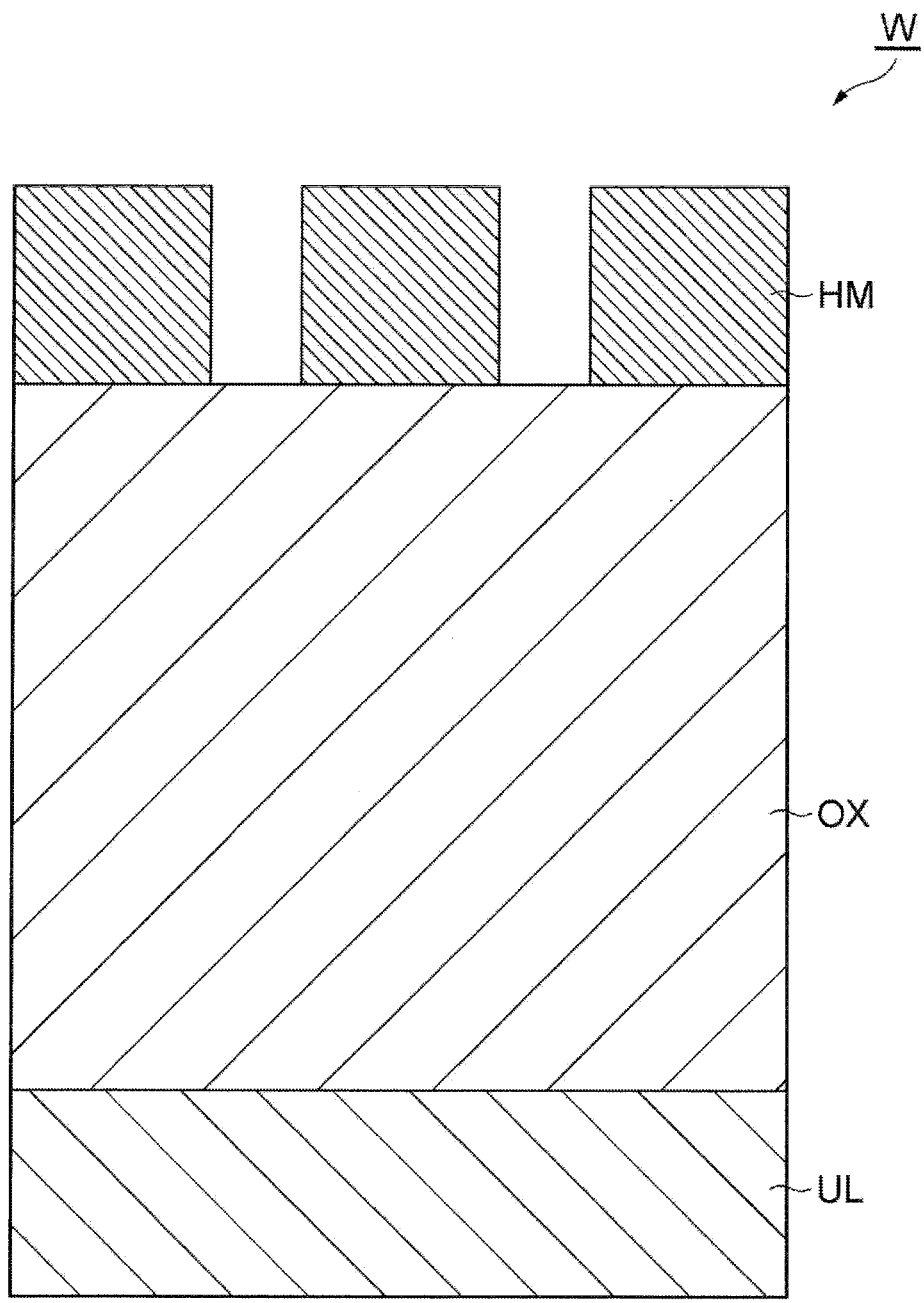
FIG. 2 is a view illustrating an example of a workpiece.

FIG. 1 is a flowchart illustrating an etching method according to an exemplary embodiment. Method MT illustrated in FIG. 1 is a method of etching a silicon oxide film on a workpiece (hereinafter, referred to as a "wafer"). FIG. 2 is a cross-sectional view illustrating an exemplary workpiece. FIG. 2 illustrates a wafer W before etched. As illustrated in FIG. 2, the wafer W includes an underlying layer UL, a silicon oxide film OX, and a hard mask HM. The silicon oxide film OX is formed on the underlying layer UL. The silicon oxide film has a thickness of, for example, 1500 nm. The hard mask HM is provided on the silicon oxide film OX. As an example, the hard mask HM is made of a polycrystalline silicon. The hard mask HM has a thickness of, for example, 700 nm. In addition, the hard mask HM is formed with an opening having a diameter of about 38 nm.

In method MT illustrated in FIG. 1, when the silicon oxide film OX is etched through the hard mask HM, a space with an aspect ratio of 50 or more is formed in the wafer W. Hereinafter, descriptions will be continued, assuming that the space formed in the wafer W is a hole.

Figure 3A:
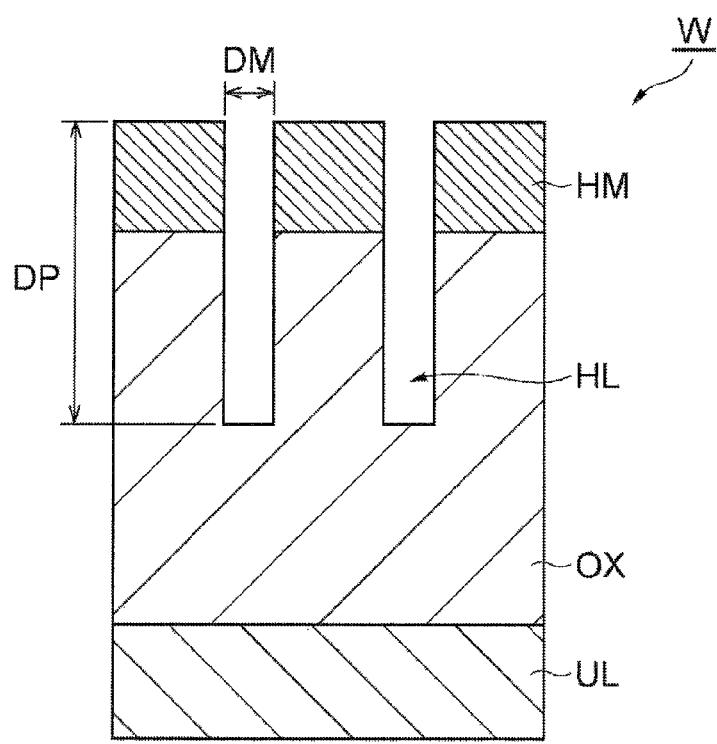
FIGS. 3A and 3B are views exemplifying cross-sectional views of a workpiece prepared in respective steps.
Figure 3B:
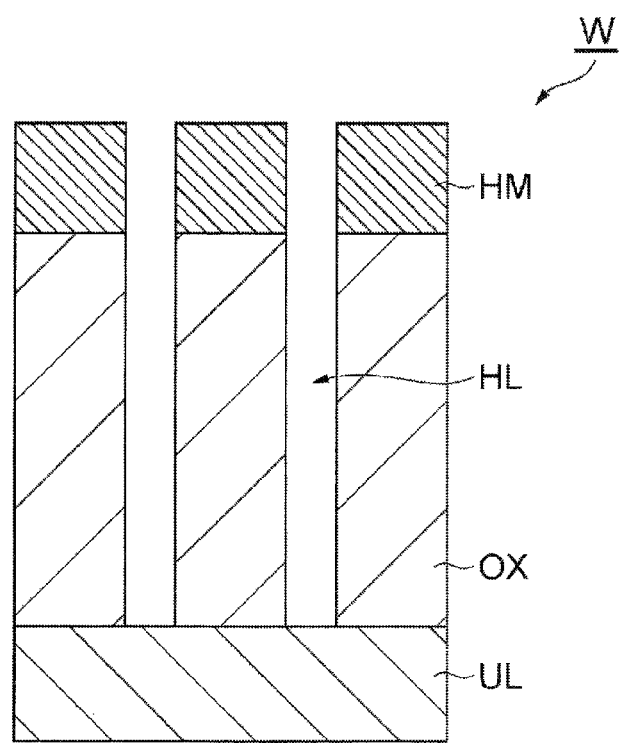

Reference will be made to FIGS. 3A and 3B together with FIG. 1. FIGS. 3A and 3B are views exemplifying cross-sectional views of a workpiece prepared in respective steps. Method MT includes step ST1 (first step) and step ST2 (second step). In step ST1, a wafer W is exposed to plasma of a fluorocarbon-based gas within a processing container of a capacitively coupled plasma processing apparatus so that a silicon oxide film OX is etched. As illustrated in FIG. 3A, holes HL reaching a midpoint of the silicon oxide film OX in the film thickness direction is formed by step ST1. Specifically, step ST1 is performed until the holes HL have an aspect ratio of 40 or less, i.e., until the holes HL have a predetermined depth. Here, assuming that the width of each hole HL is DM and the depth of the hole HL, i.e. the distance from the surface of the hard mask HM to the bottom of the hole HL is DP, the aspect ratio is defined as DP/DM.

In the step ST2 subsequent to step ST1, the wafer W is further exposed to plasma of a fluorocarbon-based gas within a processing container of a capacitively coupled plasma processing apparatus. The distance between the placing table and the upper electrode plasma processing apparatus, L2, in step ST2 is set to be at least 5/3 times of the distance between the placing table and the upper electrode, L1, in step ST1. That is, in method MT, the ratio of the distance between the placing table and the upper electrode, L2, in step ST2 in relation to the distance between the placing table and the upper electrode, L1, in step ST1 is set to be at least 5/3. According to method MT, when step ST2 is performed after step ST1, it becomes possible to form the hole HL with an aspect ratio of 50 or more as illustrated in FIG. 3B.

Figure 4:
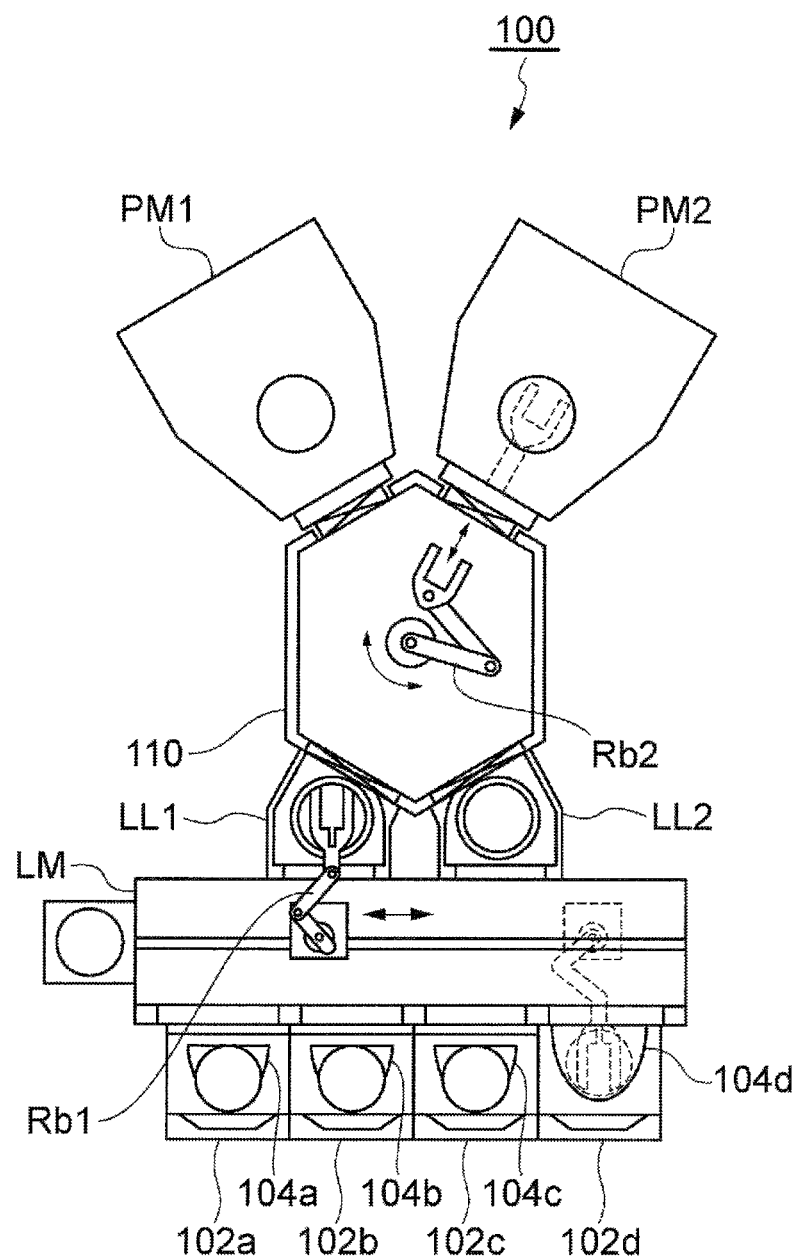
FIG. 4 is a view illustrating a processing system of an exemplary embodiment.

Hereinafter, descriptions will be made on a processing system which may be used for carrying out method M. FIG. 4 is a view illustrating a processing system of an exemplary embodiment. The processing system 100 illustrated in FIG. 4 is provided with a plurality of stages 102a to 102d, a plurality of accommodating containers 104a to 104d, a loader module LM, load-lock chambers LL1 and LL2, process modules PM1 and PM2, and a transfer chamber 110.

The stages 102a to 102d are arranged along one edge of the loader module LM. The accommodating containers 104a to 104d are mounted on the stages 102a to 102d, respectively. Wafers W are accommodated in the accommodating containers 104a to 104d.

A conveyance robot Rb1 is provided in the loader module LM. The conveyance robot Rb1 takes out a wafer W accommodated in any one of the accommodating containers 104a to 104d, and conveys the wafer W to the load-lock chamber LL1 or the load-lock chamber LL2.

The load-lock chamber LL1 and the load-lock chamber LL2 are installed along the other edge of the loader module LM and constitute preliminary pressure-reducing chambers. The load-lock chamber LL1 and the load-lock chamber LL2 are connected to the transfer chamber 110 through gate valves, respectively.

The transfer chamber 110 is a pressure-reducible chamber in which a conveyance robot Rb2 is installed. The process module PM1 and the process module PM2 are connected to the transfer chamber 110 through gate valves, respectively. The conveyance robot Rb2 takes out wafers W from the load-lock chamber LL1 or load-lock chamber LL2 and conveys the wafers W sequentially to the process module PM1 and the process module PM2.

Figure 5:
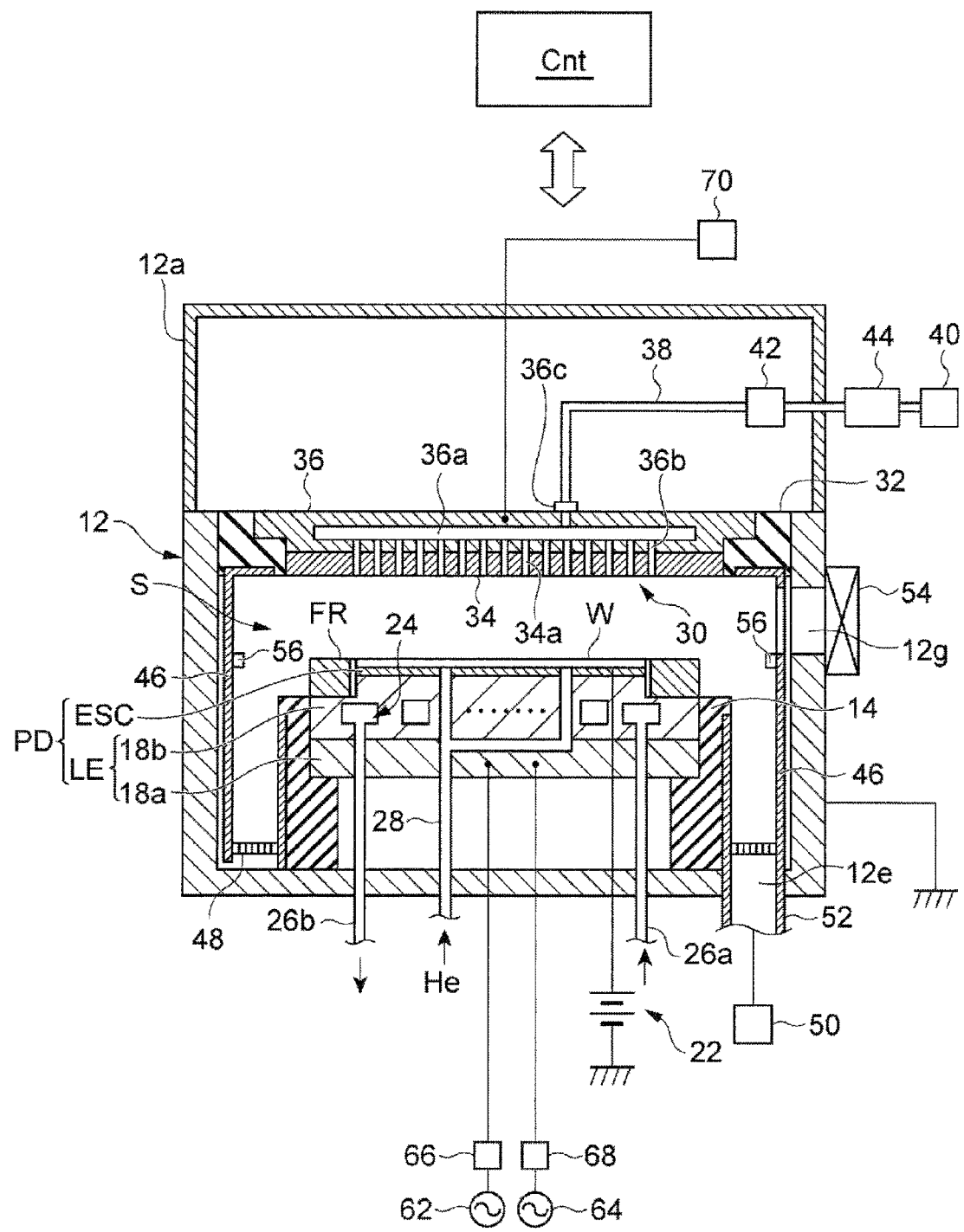
FIG. 5 is a view schematically illustrating a plasma processing apparatus.

Each of the process module PM1 and the process module PM2 is a capacitively coupled plasma processing apparatus. FIG. 5 is a view schematically illustrating a plasma processing apparatus which may be used as the process module PM1 and the process module PM2. In addition, the plasma processing apparatuses have approximately the same configurations although the distance between the placing table and the upper electrode in the process module PM2 is longer than the distance between the placing table and the upper electrode in the process module PM1. Accordingly, hereinafter, descriptions will be made on the plasma processing apparatus 10 illustrated in FIG. 5 without separately describing the process module PM1 and the process module PM2.

The plasma processing apparatus 10 is a capacitively coupled plasma etching apparatus and is provided with a substantially cylindrical processing container 12. The inner wall of the processing container 12 is made of aluminum subjected to an anodic oxidation treatment. The processing container 12 is protectively grounded.

A substantially cylindrical support unit 14 made of an insulative material is installed on the bottom portion of the processing container 12. The support unit 14 extends vertically from the bottom portion of the processing container 12 within the processing container 12. The support unit 14 supports a placing table PD installed in the processing container 12. Specifically, as illustrated in FIG. 5, the support unit 14 may support the placing table PD on the inner wall of the support unit 14.

The placing table PD holds a wafer W on the top surface thereof. The placing table PD includes a lower electrode LE and an electrostatic chuck ESC. The lower electrode LE includes a first plate 18a and a second plate 18b. The first plate 18a and the second plate 18b are made of, for example, a metal such as aluminum, substantially in a disc shape. The first plate 18a is installed on the second plate 18b and electrically connected to the first plate 18a.

The electrostatic chuck ESC is installed on the second plate 18b. The electrostatic chuck ESC has a structure in which an electrode of a conductive film is disposed between a pair of insulative layers or insulative sheets. A direct current (DC) power supply 22 is electrically connected to the electrostatic chuck ESC. The electrostatic chuck ESC may hold a wafer by attracting the wafer W using an electrostatic force such as, for example, a Coulomb force generated by the DC voltage from the DC power supply 22.

A focus ring FR is disposed on the circumferential edge of the second plate 18b to surround the edge of the wafer W and the electrostatic chuck ESC. The focus ring FR is provided so as to enhance the uniformity of etching. The focus ring FR may be made of a material which may be properly selected depending on a material of an etching target film, for example, quartz.

A coolant flow path 24 is provided inside of the second plate 18b. The coolant flow path 24 constitutes a temperature adjusting mechanism. A coolant is supplied to the coolant flow path 24 from a chiller unit installed outside through a piping 26a. The coolant supplied to the coolant flow path 24 is returned to the chiller unit through a piping 26b. In this manner, the coolant is supplied to the coolant flow path 24 to be circulated. When the temperature of the coolant is controlled, the temperature of the wafer W supported by the electrostatic chuck ESC is controlled.

In addition, the plasma processing apparatus 10 is provided with a gas supply line 28. The gas supply line 28 supplies a heat transfer gas such as, for example, He gas, from a heat transfer gas supply mechanism, to a gap between the top surface of the electrostatic chuck ESC and the rear surface of the wafer W.

In addition, the plasma processing apparatus 10 is provided with an upper electrode 30. The upper electrode 30 is disposed above the placing table PD to face the placing table PD. The lower electrode LE and the upper electrode 30 are installed to be substantially parallel to each other. Between the upper electrode 30 and the lower electrode LE, a processing space S is defined to perform a plasma processing on the wafer W.

The upper electrode 30 is supported on an upper portion of the processing container 12 via an insulative shield member 32. The upper electrode 30 may include an electrode plate 34 and an electrode support 36. The electrode plate 34 is positioned to face the processing space S, and defines a plurality of gas ejection holes 34a. In an exemplary embodiment, the electrode plate 34 is made of silicon.

The electrode support 36 removably supports the electrode plate 34 and may be made of, for example, a conductive material such as aluminum. The electrode support 36 may have a water-cooled structure. A gas diffusion chamber 36a is provided inside of the electrode support 36. From the gas diffusion chamber 36a, a plurality of gas communicating holes 36b extends downwardly to be communicated with a plurality of gas ejection holes 34a. In addition, a gas introduction port 36c is formed in the electrode support 36 to guide a processing gas to the gas diffusion chamber 36a, and a gas supply pipe 38 is connected to the gas introduction port 36c.

Figure 6:
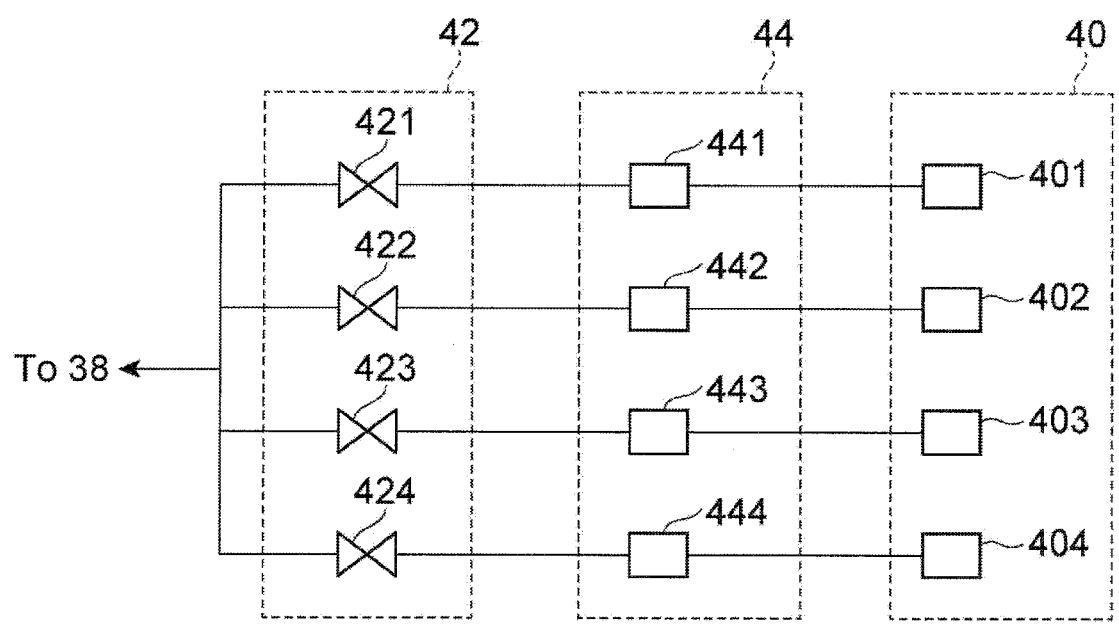
FIG. 6 is a view illustrating in detail a valve group, a flow rate controller group, and a gas source group illustrated in FIG. 5.

A gas source group 40 is connected to the gas supply pipe 38 through a valve group 42 and a flow rate controller group 44. FIG. 6 is a view illustrating in detail the valve group, the flow rate controller group, and the gas source group illustrated in FIG. 5. As illustrated in FIG. 6, the gas source group 40 includes a plurality of gas sources 401 to 404. The gas sources 401 to 404 correspond to a source of a fluorocarbon-based gas, a source of another fluorocarbon-based gas, a source of a noble gas, and a source of oxygen gas, respectively. The fluorocarbon-based gas supplied by the gas source 401 is, for example, $C_4F_6$ gas, $C_5F_8$ gas, or $C_6F_6$ gas. The fluorocarbon-based gas supplied by the gas source 402 is, for example, $C_5F_8$ gas, $C_3F_8$ gas, $CF_4$ gas, or $CHF_3$ gas. In addition, the noble gas supplied by the gas source 403 is, for example, Ar gas, Xe gas, or He gas. Further, the gas source 404 may supply N2 gas, instead of the oxygen gas.

The flow rate controller group 44 includes a plurality of flow rate controllers 441 to 444. The flow rate controllers 441 to 444 control flow rates of gases supplied from corresponding gas sources, respectively. The flow rate controllers 441 to 444 may be a mass flow controller (MFC) or an FCS. The valve group 42 includes a plurality of valves 421 to 424. The gas sources 401 to 404 are connected to the gas supply pipe 38 through the flow rate controllers 441 to 444 and the valves 421 to 424, respectively. The gases of the gas sources 401 to 404 arrive at gas diffusion chamber 36a from the gas supply pipe 38, and are ejected to the processing space S through the gas communicating holes 36b and the gas ejection holes 34a.

Returning back to FIG. 5, the plasma processing apparatus 10 may further include a ground conductor 12a. The ground conductor 12a is formed in a substantially cylindrical shape, and installed to extend to a portion higher than the height position of the upper electrode 30 from the side wall of the processing container.

In addition, in the plasma processing apparatus 10, a deposit shield 46 is removably installed along the inner wall of the processing container 12. The deposit shield 46 is also installed around the outer circumference of the support unit 14. The deposit shield 46 suppresses by-product of etching (deposit) from being adhered to the processing container 12, and may be configured by coating ceramic such as, for example, Y2O3 on an aluminum material.

At the bottom side of the processing container 12, an exhaust plate 48 is installed between the support unit 14 and the inner wall of the processing container 12. The exhaust plate 48 may be configured by coating ceramic such as, for example, Y2O3 on an aluminum material. An exhaust port 12e is formed in the processing container 12 below the exhaust plate 48. To the exhaust port 12e, an exhaust apparatus 50 is connected through an exhaust pipe 52. The exhaust apparatus 50 may include a vacuum pump such as, for example, a turbo molecular pump, and reduce the pressure within the processing container 12 to a desired vacuum level.

In addition, a wafer W carry-in/out port 12g is formed through the side wall of the processing container 12 in which the carry-in/out port 12g is configured to be opened/closed by a gate valve 54.

A conductive member (GND block) 56 is installed on the inner wall of the processing container 12. The conductive member 56 is mounted on the inner wall of the processing container 12 to be positioned at a height which is approximately the same as that of the wafer W in the height direction. The conductive member 56 is connected to the ground in a DC type to exhibit an abnormal discharge prevention effect. The conductive member 56 may be installed in the plasma generation region but the installation position thereof is not limited to the position illustrated in FIG. 5.

In addition, the plasma processing apparatus 10 further includes a first high frequency power supply 62 and a second high frequency power supply 64. The first high frequency power supply 62 is a power supply that generates a first high frequency (radio frequency (RF)) power for generating plasma. The second high frequency power supply 62 generates a high frequency power having a frequency in a range of 27 MHz to 100 MHz, for example, a frequency of 40 Hz. The first high frequency power supply 62 is connected to the lower electrode LE through a matcher 66. The matcher 66 refers to a circuit configured to match an output impedance of the first high frequency power supply 62 and an input impedance of a load side (lower electrode LE side) with each other.

The second high frequency power supply 64 is a power supply that generates a second high frequency power for drawing ions into the wafer W, i.e. a high frequency bias power. The high frequency power supply generates a high frequency power having a frequency in a range of 400 kHz to 13.56 MHz, for example, a frequency of 3.2 MHz. The second high frequency power supply 64 is connected to the lower electrode LE through a matcher 68. The matcher 68 refers to a circuit configured to match an output impedance of the second high frequency power supply 64 and an input impedance of a load side (lower electrode LE side) with each other.

In addition, the plasma processing apparatus 10 further includes a DC power supply 70. The DC power supply 70 is connected to the upper electrode 30. The DC power supply 70 may generate a negative DC voltage and apply the DC voltage to the upper electrode 30. When the negative DC voltage is applied to the upper electrode 30, the positive ions existing in the processing space S collide with the electrode plate 34. As a result, silicon is released from the electrode plate 34. The released silicon is deposited on the surface of the wafer W to be capable of protecting the hard mask HM.

In an exemplary embodiment, the plasma processing apparatus 10 may further include a control unit Cnt. The control unit Cnt is a computer including, for example, a processor, a storage unit, an input device, and a display device, and controls each component of the plasma processing apparatus 10. On the control unit Cnt, an operator may perform, for example, an input operation of a command for managing the plasma processing apparatus 10, and an operation situation of the plasma processing apparatus 10 may be visualized and displayed by the display device. In addition, control programs for controlling various processings executed in the plasma processing apparatus 10 by the processor, or programs for causing each component of the plasma processing apparatus 10 to execute according to a processing condition, i.e. processing recipes are stored in the storage unit of the control unit Cnt.

Specifically, the control unit Cnt transmits a control signal to the flow rate controllers 441 to 444, the valves 421 to 424, and the exhaust apparatus 50 so as to perform a control such that a processing gas is supplied into the processing container 12 at the time of etching in steps ST1 and step ST2, and the pressure within the processing container 12 becomes a set pressure.

In addition, the control unit Cnt may transmit a control signal to the first high frequency power supply 62, the second high frequency power supply 64, and the DC power supply 70 so as to control the magnitude of the high frequency power of the first high frequency power supply 62, the magnitude of the high frequency power of the second high frequency power supply 64, and the magnitude of the DC voltage of the DC power supply 70.

According to the processing system 100 including the plasma processing apparatus 10 as each of the process module PM1 and the process module PM2, step ST1 may be executed by the process module PM1, the wafer W may be conveyed to the process module PM2 under a vacuum environment, that is, through the transfer chamber 110, and then the step ST2 may be executed by the process module PM2. In addition, when the plasma processing apparatus includes a driving apparatus which relatively moves the placing table PD in the vertical direction with respect to the upper electrode 30, method MT may be executed using a single plasma processing apparatus, irrespective of the processing system 100.

Figure 7:
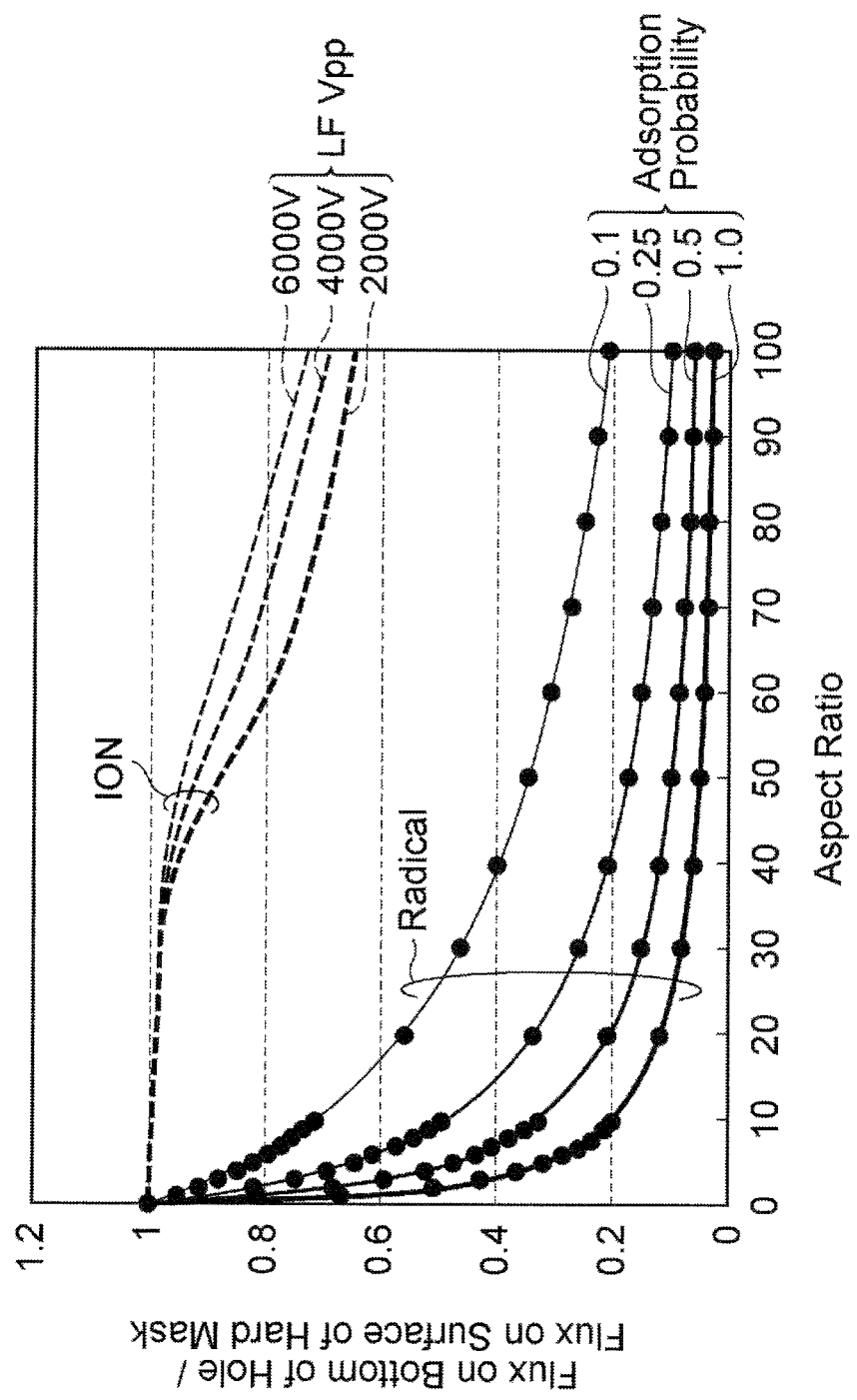
FIG. 7 is a graph representing a relationship between an aspect ratio and fluxes of ions and radicals of plasma of a fluorocarbon-based gas when a capacitively coupled plasma processing apparatus is used.

Hereinafter, method MT will be described in more detail. FIG. 7 is a graph representing a relationship between an aspect ratio and fluxes of ions and radicals of plasma of a fluorocarbon-based gas when a capacitively coupled plasma processing apparatus is used. The graph illustrated in FIG. 7 was prepared based on data acquired by a calculating simulation. In the graph of FIG. 7, the horizontal axis represents aspect ratios of holes, and the vertical axis represents values obtained by dividing fluxes of ions or radicals on the bottoms of holes by fluxes of ions or radicals on the surface of a hard mask.

Figure 8B:
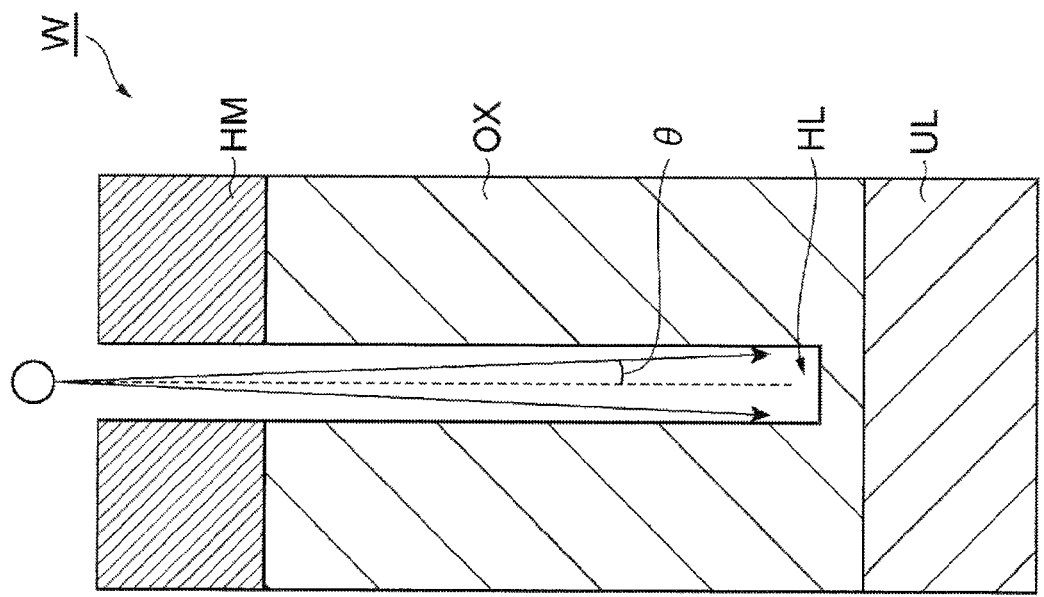
FIGS. 8A and 8B are views illustrating behaviors of radicals and ions within a hole.
Figure 8A:
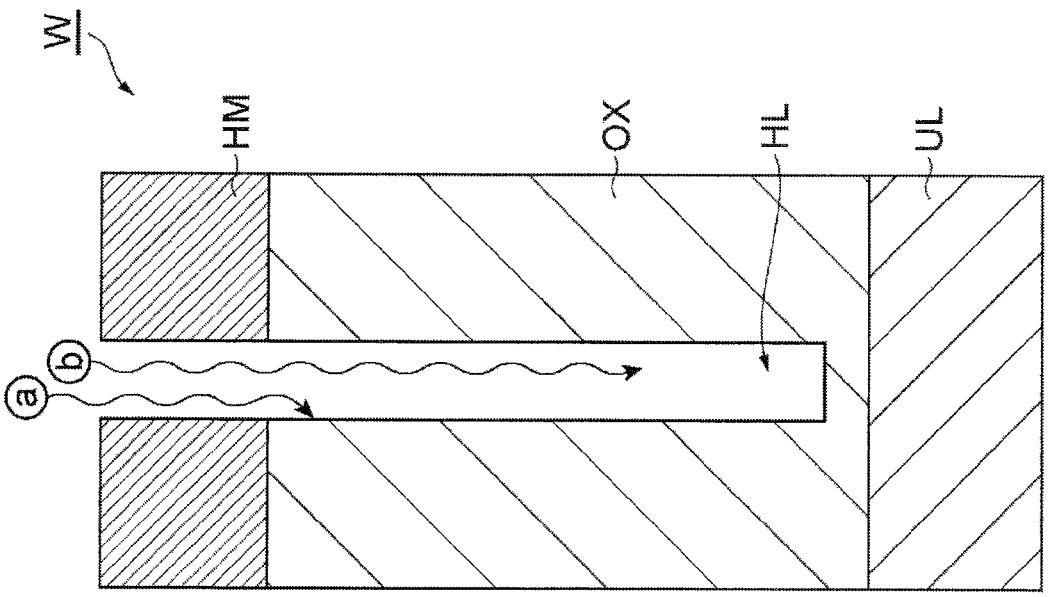

As illustrated in FIG. 7, in the capacitively coupled plasma processing apparatus, even if an aspect ratio of a hole is low, a radical does not reach a deep portion of the hole. In addition, a low order radical with high adsorption probability with respect to a side wall defining the hole may reach a deeper portion of the hole than a high order radical. That is, as illustrated in FIG. 8A, a high order radical (indicated by "a" enclosed by a circle in the drawing) is adsorbed to an upper portion of the side wall of the hard mask HM or the side wall of the silicon oxide film OX which defines the hole HL rather than reaching a deep portion of the hole HL. Meanwhile, a low order radical (indicated by "b" enclosed by a circle in the drawing) may enter the inside of the hole HL to a relatively deeper position.

As illustrated in FIG. 7, in a hole with an aspect of 40 or less, ions may reach a deep portion of the hole. However, when the aspect ratio exceeds 40, the amount of ions reaching the deep portion of the hole is reduced. In addition, as a voltage of a high frequency bias power, i.e., LF Vpp increases, the amount of ions reaching the deep portion of the hole increases. This is because, when LF Vpp is high, the ion energy is high and the distribution of incident angles of the ions with respect to the vertical direction (angle θ illustrated in FIG. 8B) is small.

Accordingly, it is believed that it is possible to form a hole with a high aspect ratio of 50 or more in a wafer W by increasing the ion energy and the ion flux. However, the etching rate of the hard mask HM increases depending on the ion energy and the ion flux. Accordingly, when both the ion energy and ion flux are increased, the etching rate of the hard mask HM is increased. That is, a selection ratio of etching of the silicon oxide film in relation to the etching of the hard mask HM is reduced. Meanwhile, the etching rate of the silicon oxide film OX increases mainly depending on the ion energy. Accordingly, in order to form a hole with an aspect ratio of 50 or more in a wafer W while suppressing etching of the hard mask HM, it is required to increase the ion energy and reduce the ion flux.

In order to increase the ion energy and reduce the ion flux, a method of reducing the high frequency bias power for plasma generation, and a method of increasing the distance between the placing table and the upper electrode may be considered. FIGS. 9A to 9D illustrate graphs representing a variation in plasma characteristic depending the high frequency power of the first high frequency power supply, i.e. HF Power, and a variation in plasma characteristic depending on the distance between the placing table and the upper electrode.

Figure 9C:
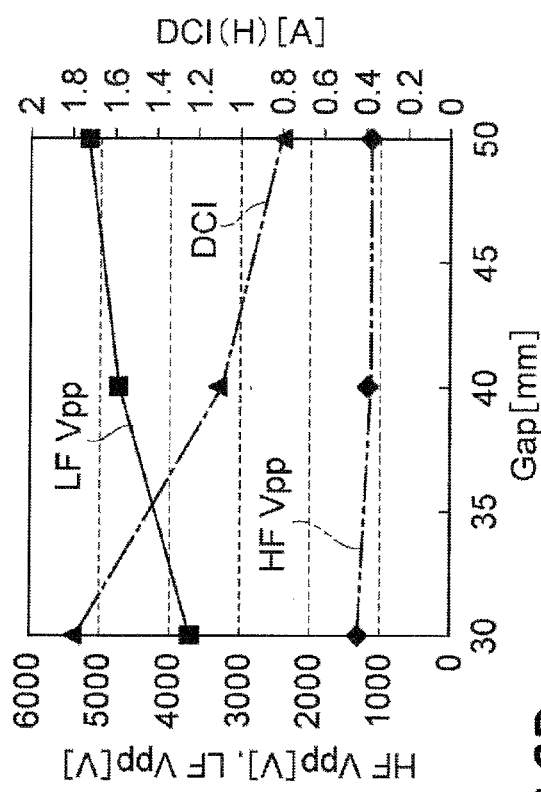
FIGS. 9A to 9D illustrate graphs representing a variation in plasma characteristic depending the high frequency power of the first high frequency power supply, i.e. HF Power, and a variation in plasma characteristic depending on the distance between the placing table and the upper electrode.
Figure 9D:
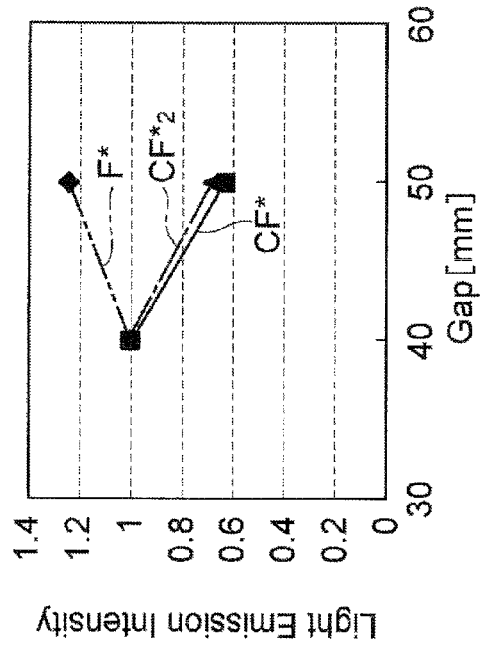
Figure 9A:
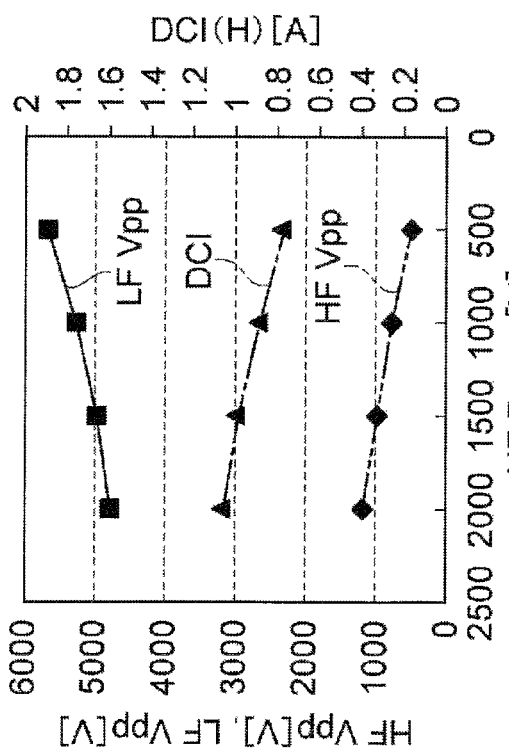
Figure 9B:
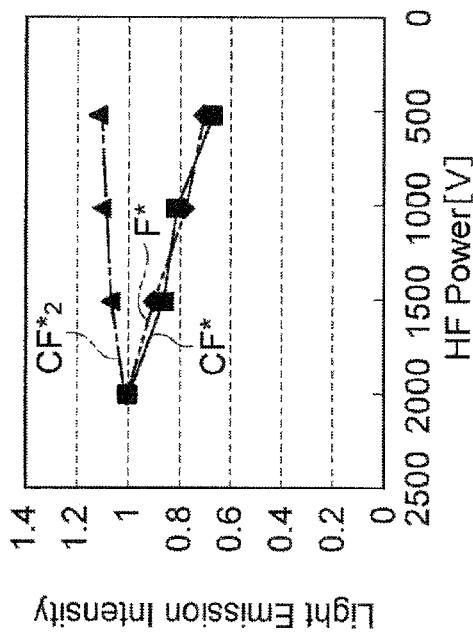

Specifically, FIG. 9A represents a relationship between HF Power (horizontal axis) and each of high frequency voltage (HF Vpp) based on high frequency power generated by the first high frequency power supply 62, high frequency voltage (LF Vpp) based on high frequency bias power generated by the second high frequency power supply 64, and current DCI flowing into the DC power supply 70 from the upper electrode 30. The current DCI reflects ion flux. That is, as the ion flux is increased, DCI is increased. In addition, FIG. 9B represents a relationship between HF Power (horizontal axis) and each of light emission intensity of $CF_2$ radicals ($CF_2$*), light emission intensity of CF radicals (CF*), and light emission intensity of fluorine radicals (F*). The light emission intensity of each of the radicals in FIG. 9B was acquired by optical emission spectroscopy (OES). The light emission intensities on the vertical axis of FIG. 9B were standardized to those measured when the HF Power was 2000 W.

FIG. 9C represents a relationship between the distance between the placing table PD (top surface of the electrostatic chuck ESC) and the upper electrode 30 (horizontal axis: Gap) and each of high frequency voltage HF Vpp, high frequency voltage LF Vpp, and current DCI. In addition, FIG. 9D illustrates a relationship between the distance between the placing table PD (the top surface of the electrostatic chuck ESC) and each of light emission intensity of $CF_2$ radicals ($CF_2$*), light emission intensity of CF radicals (CF*), and light emission intensity of fluorine radicals (F*). The light emission intensity of each of the radicals in FIG. 9D was acquired by optical emission spectroscopy (OES). The light emission intensities on the vertical axis of FIG. 9D were standardized to those measured when the distance (Gap) was 40 mm.

As represented in FIG. 9A, it is found that when high frequency power (HF Power) is reduced, the high frequency voltage (LF Vpp) is increased, i.e. the ion energy is increased. In addition, it is found that when high frequency power (HF Power) is reduced, the current DCI is reduced, that is, the ion flux is reduced. However, as represented in FIG. 9A, when the high frequency power (HF Power) is reduced, the high frequency voltage (HF Vpp) is reduced so that the electron temperature in the processing space S is varied. As a result, as represented in FIG. 9B, high order radicals such as, for example, $CF_2$ radicals are increased, and low order radicals such as fluorine radicals are reduced. Due to a high molecular weight, the high order radicals have a high adhering coefficient and are consumed until they reach the inside of the hole HL. Accordingly, the increase of high order radicals weakens the side wall protection effect of in the hole by CF (fluorocarbon) deposit, which causes in turn a degradation of bowing. Accordingly, when the high frequency power (HF Power) is reduced, it may be possible to increase the aspect ratio of the hole HL but bowing may occur just below the hard mask HM.

Meanwhile, as represented in FIG. 9C, when the distance (Gap) between the placing table PD and the upper electrode 30, it may be possible to increase the high frequency voltage (LF Vpp) and reduce the current DCI while suppressing the variation of the high frequency voltage (HF Vpp). More specifically, when the distance (Gap) is set to be 50 mm or more, it is possible to obtain LF Vpp exceeding 5000 V and DCI less than 1 A. Accordingly, when the distance (Gap) is set to be 50 mm or more, it may be possible to increase the ion energy and to reduce the ion flux. In addition, as represented in FIG. 9D, when the distance (Gap) is set to be 50 mm or more, it may be possible to reduce the high order radicals and increase the low order radicals. Due to the low molecular weight, the low order radicals have a low adhering coefficient and may reach the inside of the hole HL, the increase of the low order radicals causes the side wall protection effect in the hole by the CF deposit to extend to the bottom of the hole. As a result, occurrence of bowing may be suppressed. Accordingly, when the distance (Gap) between the upper electrode 30 and the placing table PD is set to be 50 mm or more, it may be possible to form a hole with the aspect ratio of 50 or more as well as to suppress occurrence of bowing while suppressing the selection ratio of etching of the silicon oxide film OX in relation to etching of the hard mask HM.

Method MT is based on the principles described above, and in a period where a hole HL with a small aspect ratio is formed, etching of the silicon oxide film OX is performed by both ions and radicals to enhance the etching rate. That is, in a period where the aspect ratio of holes is 40 or less, the etching of the silicon oxide film OX is performed by step ST1. For example, when the diameter of a wafer is 300 mm, the distance between the placing table, i.e. the surface of the electrostatic chuck, and the upper electrode is set to be 30 mm in step ST1. In the subsequent step ST2, the distance between the placing table and the upper electrode is set to be at least 5/3 times of the distance between the placing table and the upper electrode in step ST1 so that silicon oxide film OX is etched. For example, when the diameter of a wafer W is 300 mm, the distance between the placing table and the upper electrode is set to be 50 mm or more in step ST2. Accordingly, a hole HL with the aspect ratio of 50 or more may be formed while suppressing reduction of the selection ratio of etching of the silicon oxide film OX in relation to etching of the hard mask HM. In addition, occurrence of bowing may also be suppressed. As described above, although the ratio of the distance between the placing table and the upper electrode in step ST2 step in relation to the distance between the placing table and the upper electrode in step ST1 is at least 5/3 times, the lower limit of the distance between the placing table and the upper electrode in step ST2 is not limited to 50 mm, and may be properly set based on the diameter of a wafer W.

In method MT, in the period from step ST1 to step ST2, plasma is generated without changing the gas species. That is, in method MT, during the period from step ST1 to step ST2, holes HL may be formed without performing a processing of forming a protective film on the surface of a wafer W. Accordingly, it is possible to prevent an opening of the hard mask HM from being blocked by the protective film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method of a silicon oxide film formed on a substrate, the method comprising:

forming a hard mask on the silicon oxide film;

etching the hard mask in order to form an opening on the hard mask so that a surface of the silicon oxide is exposed;

exposing the substrate formed with the silicon oxide film and the hard mask having the opening to plasma of a fluorocarbon-based gas within a processing container of a capacitively coupled plasma processing apparatus, which includes a placing table serving as a lower electrode and an upper electrode being spaced apart from the lower electrode with a predetermined distance, thereby etching the silicon oxide film through the opening of the hard mask in order to form a hole in the silicon oxide film;

changing the predetermined distance between the lower electrode and the upper electrode such that the distance between the lower electrode and the upper electrode becomes at least 5/3 times of the predetermined distance; and further exposing, with the distance between the placing table and the upper electrode at least 5/3 times the predetermined distance, the substrate formed with the hole in the silicon oxide to the plasma of a fluorocarbon-based gas to further etch the silicon oxide through the hole until an aspect ratio of the hole becomes about 50 or more while suppressing an occurrence of bowing and a reduction of a selection ratio between the silicon oxide and the hard mask, the aspect ratio of the hole being defined as a depth of the hole divided by a width of the hole.

2. The etching method of claim 1, wherein the distance between the placing table and the upper electrode after the changing step is 50 mm or more.

3. The etching method of claim 2, wherein the distance between the placing table and the upper electrode in the further exposing the substrate to the plasma is set to be 50 mm or more to reduce high order radicals including $CF_2$ radicals and increase low order radicals including fluorine radicals having a lower adhering coefficient than one of the high order radicals so that a side wall protection effect in the hole by a fluorocarbon deposit generated by the low order radicals is extended to a bottom of the hole, thereby suppressing occurrence of bowing below the hard mask.

4. The etching method of claim 1, wherein the exposing the substrate to the plasma of the fluorocarbon-based gas is performed until a space with an aspect ratio of 40 or less is formed in the silicon oxide film.

5. The etching method of claim 1, wherein a gas species of a gas supplied into the processing chamber is unchanged during a period from the exposing the substrate to the plasma of the fluorocarbon-based gas to the further exposing the substrate to the plasma of the fluorocarbon-based gas.

6. The etching method of claim 1, wherein a silicon-containing gas is not supplied into the processing container during a period from the exposing the substrate to the plasma of the fluorocarbon-based gas to the further exposing the substrate to the plasma of the fluorocarbon-based gas.

7. The etching method of claim 1, wherein the further exposing the substrate to the plasma is performed in a condition where a radio frequency voltage based on a radio frequency bias power generated by a second radio frequency power supply is increased and a current flowing from the upper electrode is reduced while suppressing variation of a radio frequency voltage based on a radio frequency power generated by a first radio frequency power supply.

8. The etching method of claim 1, wherein the further exposing the substrate to the plasma is performed in a condition where a radio frequency voltage based on a radio frequency bias power generated by a second radio frequency power supply is increased and a current flowing from the upper electrode is reduced.

* * * * *